| (12) | United States Patent | (10) Patent No.: US 10,529,789 B2 |
|---|---|---|
| | Kim et al. | (45) Date of Patent: Jan. 7, 2020 |

(54) DOUBLE-SIDED DISPLAY DEVICE

(71) Applicant: SAMSUNG DISPLAY CO., LTD., Yongin-si, Gyeonggi-do (KR)

(72) Inventors: Hee Na Kim, Yongin-si (KR); Sang Jin Park, Yongin-si (KR); Yong Hwan Ryu, Yongin-si (KR); Tae Hyeok Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 15 days.

(21) Appl. No.: 15/867,803

(22) Filed: Jan. 11, 2018

(65) Prior Publication Data

US 2019/0081122 A1 Mar. 14, 2019

(30) Foreign Application Priority Data

Sep. 12, 2017 (KR) .................... 10-2017-0116309

(51) Int. Cl.
  *H01L 27/32* (2006.01)
  *H01L 51/52* (2006.01)
  *H01L 51/56* (2006.01)

(52) U.S. Cl.
  CPC ........ *H01L 27/3267* (2013.01); *H01L 27/322* (2013.01); *H01L 27/3248* (2013.01); *H01L 27/3276* (2013.01); *H01L 51/5253* (2013.01); *H01L 51/56* (2013.01); *H01L 27/3258* (2013.01); *H01L 2227/323* (2013.01)

(58) Field of Classification Search
  CPC ............. H01L 27/3267; H01L 27/3248; H01L 27/3258; H01L 27/3244; H01L 27/3246; H01L 27/3251; H01L 27/3253; H01L 27/326; H01L 27/3262; H01L 27/3265;
  (Continued)

(56) References Cited

U.S. PATENT DOCUMENTS

2004/0227159 A1* 11/2004 Nakashima .......... G09G 3/3225
  257/202
2004/0263056 A1* 12/2004 Seo ...................... G09G 3/3216
  313/500
  (Continued)

FOREIGN PATENT DOCUMENTS

KR 10-2011-0119486 A 11/2011
KR 10-2016-0076066 A 6/2016
  (Continued)

OTHER PUBLICATIONS

Cho, et al., Department of Laser & Electron Beam Application, Korean Institute of Machinery & Materials, "Drilling of strengthened glass using pico-second laser", 2012, 250.

*Primary Examiner* — Allen L Parker
*Assistant Examiner* — Gustavo G Ramallo
(74) *Attorney, Agent, or Firm* — Kile Park Reed & Houtteman PLLC

(57) ABSTRACT

A display device includes a substrate, a first thin-film transistor (TFT), a first organic light-emitting diode (OLED), and a second OLED. The TFT is on a first surface of the substrate and includes a first output electrode and a second output electrode. The OLED is on the first surface of the substrate and is electrically connected to the first output electrode of the TFT. The second OLED is on a second surface of the substrate and is electrically connected to the second output electrode of the TFT.

15 Claims, 18 Drawing Sheets

(58) Field of Classification Search
CPC ............. H01L 27/3269; H01L 27/3272; H01L 27/3274; H01L 27/3276
See application file for complete search history.

(56) References Cited

U.S. PATENT DOCUMENTS

| | | | |
|---|---|---|---|
| 2005/0057149 A1* | 3/2005 | Herranen | G09F 9/33 |
| | | | 313/504 |
| 2007/0176554 A1* | 8/2007 | Kwak | C03C 8/24 |
| | | | 313/512 |
| 2009/0051285 A1* | 2/2009 | Kajiyama | H01L 27/3267 |
| | | | 313/506 |
| 2014/0091331 A1 | 4/2014 | Ning et al. | |
| 2014/0284558 A1* | 9/2014 | Yang | H01L 27/3262 |
| | | | 257/40 |

FOREIGN PATENT DOCUMENTS

| | | |
|---|---|---|
| KR | 10-2016-0120823 A | 10/2016 |
| KR | 10-2017-0020634 A | 2/2017 |

* cited by examiner

DOUBLE-SIDED DISPLAY DEVICE

CROSS-REFERENCE TO RELATED APPLICATION

Korean Patent Application No. 10-2017-0116309, filed on Sep. 12, 2017, and entitled, "Display Device and Method of Manufacturing the Same," is incorporated by reference herein in its entirety.

BACKGROUND

1. Field

One or more embodiments described herein relate to a display device and a method for manufacturing a display device.

2. Description of the Related Art

A variety of displays have been developed. Examples include liquid crystal displays and organic light-emitting displays. An organic light-emitting display generates images based on light emitted from pixels that include organic light-emitting diodes (OLEDs). Each OLED may have an organic light-emitting layer between two electrodes. Electrons and holes injected from the electrodes recombine in the organic light-emitting layer to form excitons. Light is emitted when the excitons fall from an excited state to a ground state. OLED displays are desirable because of their low power consumption, thinness, wide viewing angle, excellent luminance and contrast, and fast response speed.

One type of display that has recently been developed is known as a double-sided display device. This type of display generates images on front and rear surfaces and thus is suitable for use tablet PCs, notebook computers, digital information displays (DID), and other electronic devices.

SUMMARY

In accordance with one or more embodiments, a display device includes a supporting substrate having first surface and second surfaces; a thin-film transistor (TFT) on the first surface of the supporting substrate and including a control electrode, an input electrode, a first output electrode, a second output electrode, and an active layer; a first organic light-emitting diode (OLED) on the first surface of the supporting substrate and electrically connected to the first output electrode of the TFT; and a second OLED on the second surface of the supporting substrate and electrically connected to the second output electrode of the TFT.

The first output electrode and the second output electrodes may be electrically connected to a source area of the active layer. The first OLED may include a first anode electrically connected to the first output electrode, a first cathode spaced apart from and facing the first anode, and a first organic light-emitting layer between the first anode and the first cathode. The second OLED may include a second anode electrically connected to the second output electrode, a second cathode spaced apart from and facing the second anode, and a second organic light-emitting layer between the second anode and the second cathode, the second organic light-emitting layer to emit the same color light as the first organic light-emitting layer. The first organic light-emitting layers and the second organic light-emitting layers may partially overlap with each other.

The first cathode and the supporting substrate may be spaced apart from each other with the first anode therebetween, and the second cathode and the supporting substrate may be spaced apart from each other with the second anode therebetween. When an input signal is applied to the TFT, an amount of current flowing through the first output electrode may equal the amount of current flowing through the second output electrode.

The display device may include a barrier layer between the supporting substrate and the active layer; a gate insulating film between the active layer and the control electrode and insulating the active layer from the control electrode; and an interlayer insulating film between the control electrode and the first OLED, wherein: the first output electrode is in contact with a first surface of a source area of the active layer via a first through hole, which penetrates the interlayer insulating film and the gate insulating film, and the second output electrode is in contact with a second surface of the source area of the active layer via a second through hole, which penetrates the supporting substrate and the barrier layer. The second through hole may have a circular shape in a plan view and may be tapered from the second surface to the first surface of the supporting substrate. The first output electrodes and the second output electrodes may partially overlap with each other.

The display device may include a first planarization layer between the interlayer insulating film and the first OLED; a first encapsulation area on the first OLED and encapsulating the first OLED; a second planarization layer between the supporting substrate and the second OLED; and a second encapsulation area on the second OLED and encapsulating the second OLED. The display device may include a thickness control layer directly on the second surface of the supporting substrate, wherein the second through hole penetrates the thickness control layer.

The display device may be a double-sided display device having first display areas and second display areas, the first display area may be on the first surface of the supporting substrate and includes a first pixel to emit light of first color and a second pixel to emit light of a second color different from the first color, the second display area may be on the second surface of the supporting substrate and includes a third pixel to emit light of the first color and a fourth pixel to emit light of the second color, the first OLED may define the first pixel of the first display area, and the second OLED may define the third pixel of the second display area.

The display device may include a third OLED on the first surface of the supporting substrate and defining the second pixel of the first display area, wherein the second OLEDs and the third OLEDs partially overlap with each other. The display device may include a third OLED on the first surface of the supporting substrate and defining the second pixel of the first display area; a first color conversion pattern on the first OLED; and a second color conversion pattern on the third OLED, wherein the first OLEDs and the third OLEDs emit light of a same color.

In accordance with one or more other embodiments, a display device includes a TFT to control an amount of current flowing through a channel area of an active layer; a first OLED electrically connected to a first output terminal of the TFT; and a second OLED electrically connected to a second output terminal of the TFT, wherein the first OLEDs and the second OLEDs are to emit light in different directions.

In accordance with one or more other embodiments, a method of manufacturing a display device, comprising: preparing a supporting substrate, an active layer on the supporting substrate, and an interlayer insulating film on the active layer; forming a first through hole that partially exposes a first surface of the active layer; forming a second through hole that partially exposes a second surface of the active layer; forming a first OLED that is electrically connected to the active layer via the first through hole; and forming a second OLED that is electrically connected to the active layer via the second through hole.

Forming the first through hole may include exposing the first surface of the active layer by partially patterning the interlayer insulating film, and forming the second through hole may include exposing the second surface of the active layer, by forming a hole that penetrates the supporting substrate using a laser. Forming the second through hole may be performed before the forming the first through hole.

The method may include forming a first output electrode that is inserted in the first through hole, between forming the first through hole and forming the first OLED; and forming a second output electrode that is inserted in the second through hole, between forming the second through hole and forming the second OLED, wherein the first OLED is electrically connected to the active layer via the first output electrode, and wherein the second OLED is electrically connected to the active layer via the second output electrode.

The method may include forming a first output electrode that is inserted in the first through hole; forming a second output electrode that is inserted in the second through hole; forming a first planarization layer on the first output electrode; and forming a second planarization layer on the second output electrode, wherein: forming the first through hole is performed before the forming the second OLED, forming the second through hole is performed before the forming the first OLED, forming the first output electrode is performed before the forming the second planarization layer, forming the second output electrode is performed before the forming the first planarization layer, forming the first planarization layer is performed before the forming the second OLED, and forming the second planarization layer is performed before the forming the first OLED.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
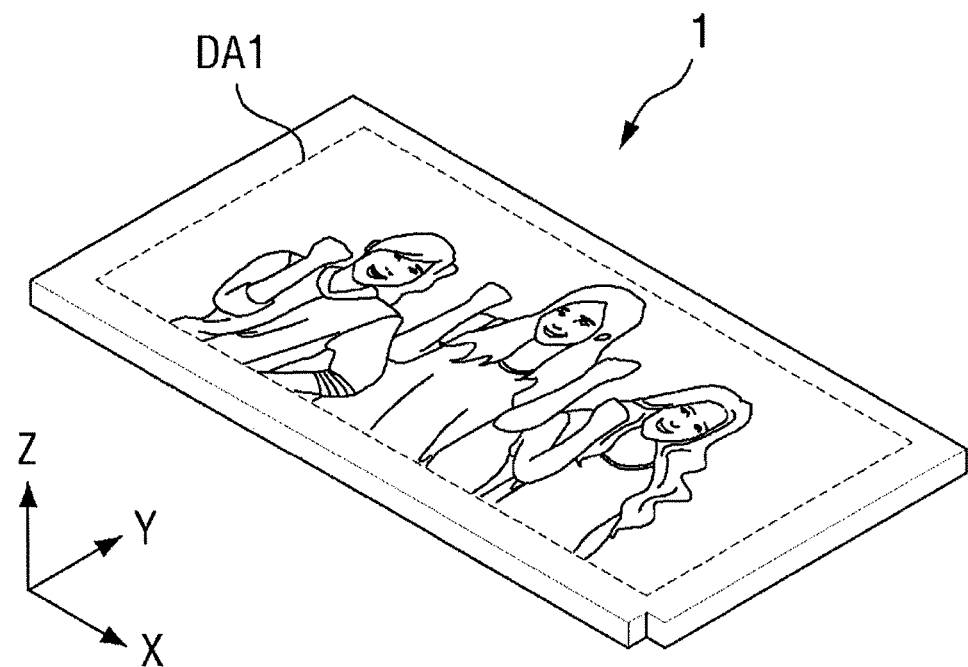
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

"About," "approximately," or "substantially," as used herein is inclusive of the stated value and means within an acceptable range of deviation for the particular value as determined by one of ordinary skill in the art, considering the measurement in question and the error associated with measurement of the particular quantity (e.g., the limitations or tolerances of the measurement system). For example, "about," "approximately," or "substantially," may mean within one or more standard deviations, or within ±30%, 20%, 10%, 5% of the stated value.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
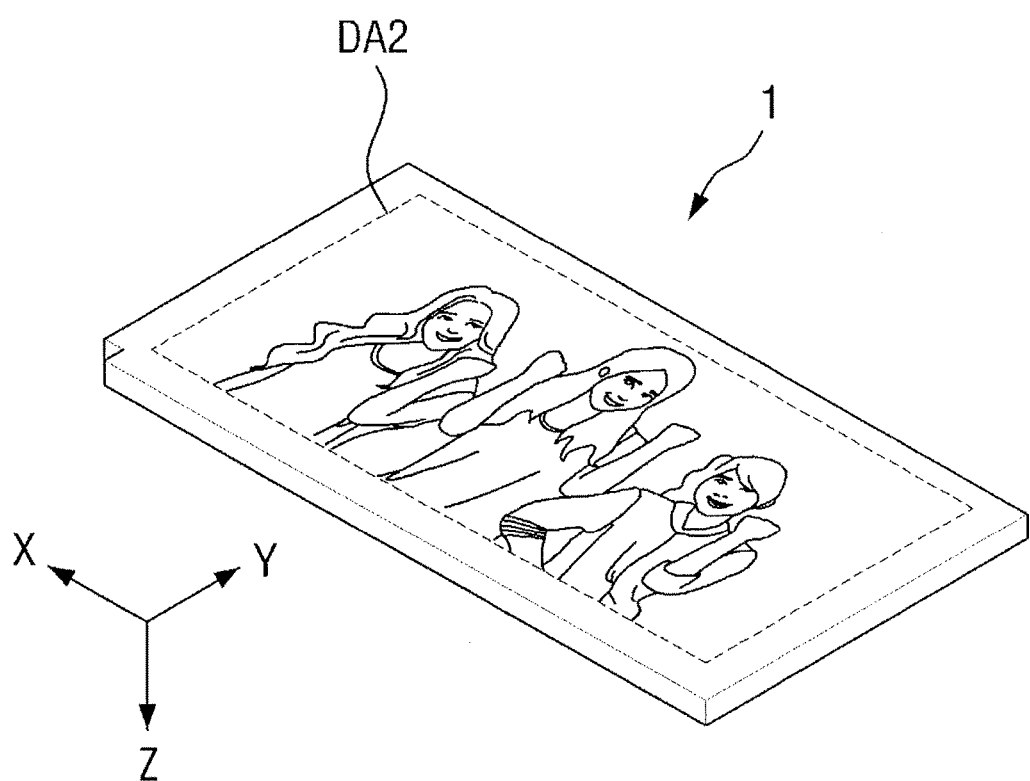
FIG. 2 illustrates a rear perspective view of the display device of FIG. 1.

FIG. 1 illustrates an embodiment of a display device 1, and FIG. 2 illustrates an embodiment of a rear perspective view of the display device 1 of FIG. 1.

Referring to FIGS. 1 and 2, the display device 1 may be a double-sided display device having first and second display areas DA1 and DA2. Each of the first and second display areas DA1 and DA2 includes a plurality of pixels and contributes to the display of an actual image by allowing the pixels to emit light of different colors. The term "pixel" may refer to a single area that is recognizable by a user and is obtained by dividing a display area for the display of color light in a plan view.

Each of the pixels emits light of a predetermined color. For example, the pixels may be minimal units of the first or second display area DA1 or DA2 that emit light of various colors independently of one another. The pixels may be arranged substantially in a matrix form in a plan view along the first and second directions X and Y.

The first display area DA1 is on a first surface (in FIG. 1, the front surface) of the display device 1 and displays an image to a viewer who views the first surface of the display device 1. The second display area DA2 is on a second surface (in FIG. 1, the rear surface) of the display device 1 and displays an image to a viewer who views the second surface of the display device 1. FIGS. 1 and 2 illustrate an example in which first and second display surfaces formed by the first and second display areas DA1 and DA2, respectively, are parallel to each other and face opposite directions. In one embodiment, the first and second display surfaces may face opposite directions to form a predetermined angle with each other or a third display surface may be further provided.

When the display device 1 is operating, the first and second display areas DA1 and DA2 may display images at the same time. In an example, an image viewed from the first display area DA1 and an image viewed from the second display area DA2 may be substantially the same except that they are reversed from each other.

Figure 3:
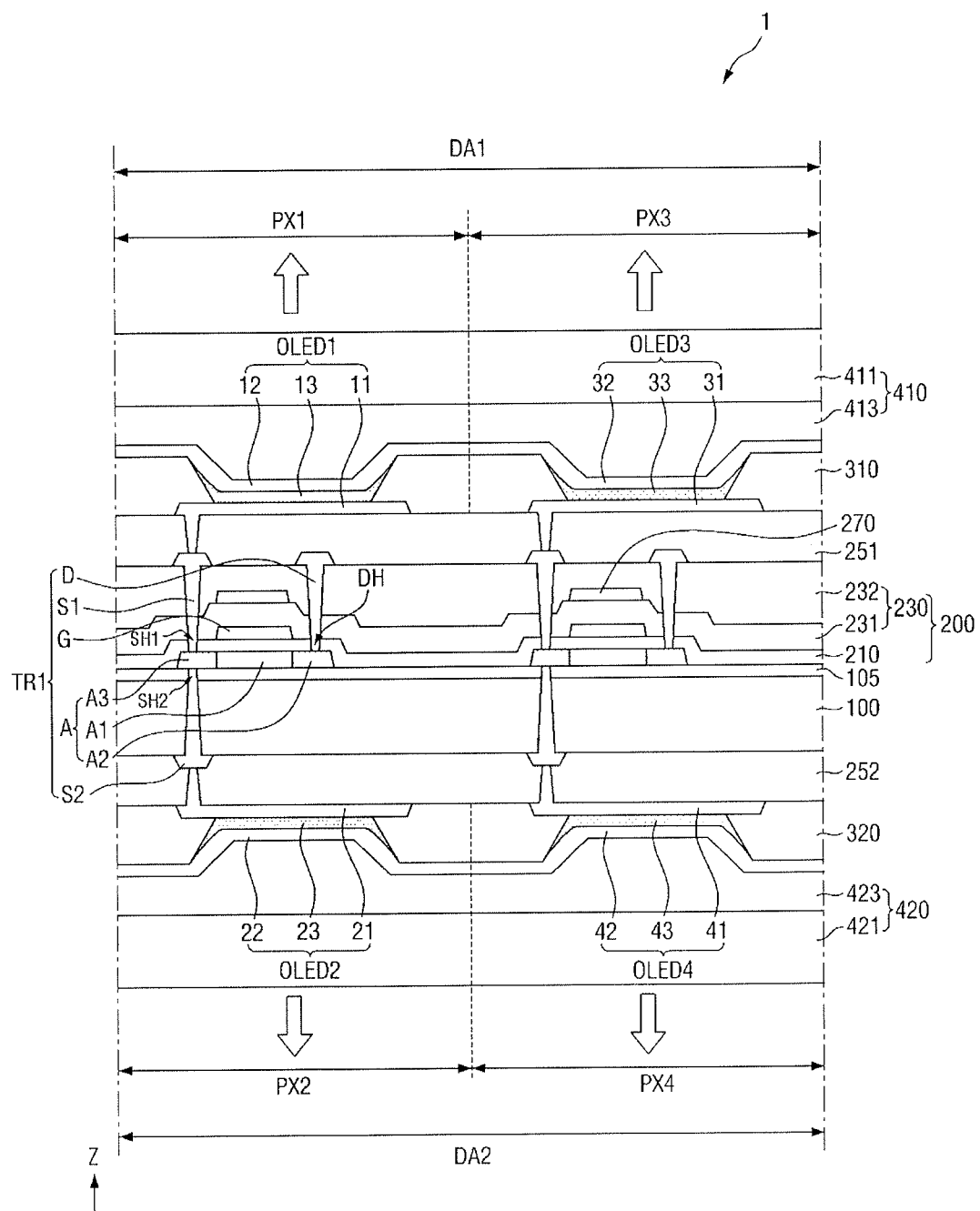
FIG. 3 illustrates a cross-sectional view of the display device of FIG. 1.
Figure 4:
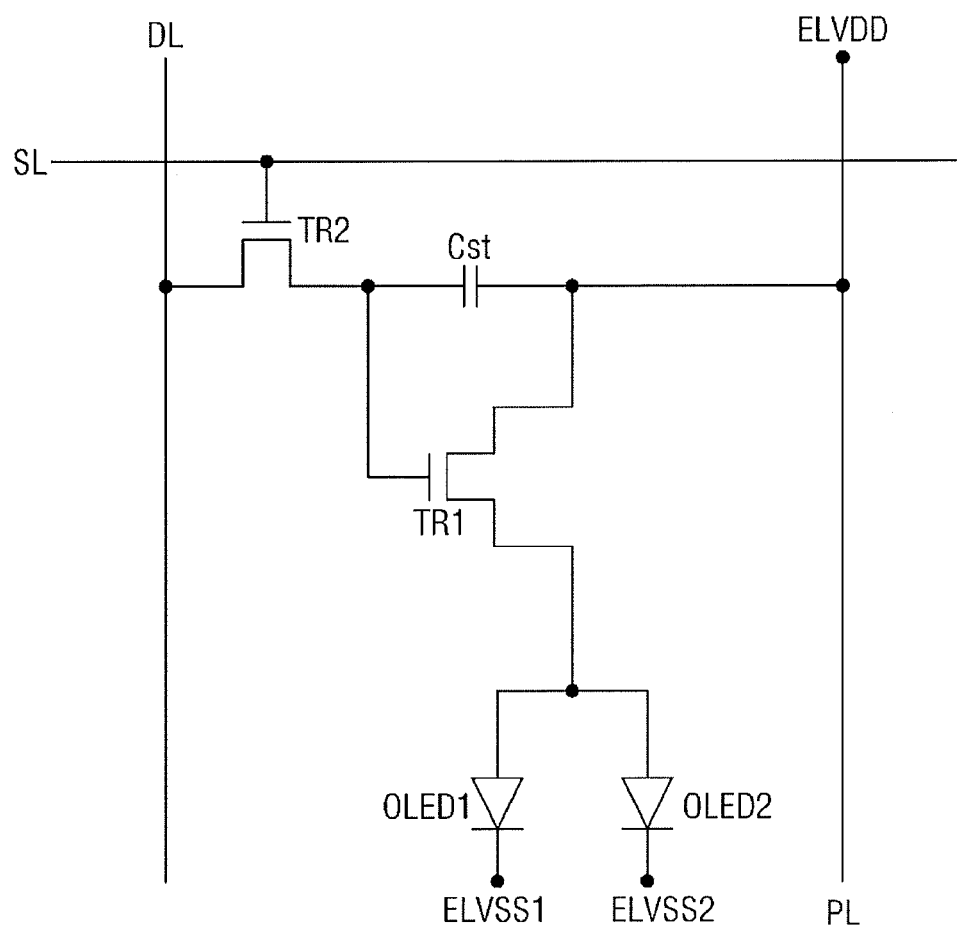
FIG. 4 illustrates an embodiment of a pixel.

FIG. 3 illustrates an embodiment of a cross-sectional view of the display device of FIG. 1. FIG. 4 is an equivalent circuit diagram of pixels, which, for example, may be representative of the pixels in the display device 1, e.g., the equivalent circuit diagram of FIG. 4 may correspond to first and second pixels PX1 and PX2 defined by first and second organic light-emitting diodes (OLEDs) OLED1 and OLED2, respectively.

Referring to FIGS. 1 through 4, the display device 1 includes a supporting substrate 100, a driving element layer 200, and the first and second OLEDs OLED1 and OLED2, and may further include third and fourth OLEDs OLED3 and OLED4.

The supporting substrate 100 may be a transparent or opaque insulating substrate. In some exemplary embodiments, the supporting substrate 100 may have flexibility. In an example, the supporting substrate 100 may be formed of a glass material, a quartz material, or a plastic material such as polyimide (PI), polycarbonate (PC), polyethylene terephthalate (PET), or polyacrylate (PA).

A barrier layer 105 may be on a first surface (in FIG. 3, the top surface) of the supporting substrate 100. The barrier layer 105 may protect the supporting substrate 100 and may prevent impurities such as moisture or air from infiltrating into the supporting substrate 100. In an example, the barrier layer 105 may prevent the supporting substrate 100 from being damaged in the process of forming an active layer A. The barrier layer 105 may include an inorganic material, e.g., silicon nitride (SiNx), silicon oxide (SiOx), silicon nitride oxide (SiNxOy), or silicon oxynitride (SiOxNy). In one embodiment, the barrier layer 105 may be omitted.

A driving transistor TR1 and the driving element layer 200 may be on the barrier layer 105. The driving element layer 200 may include a plurality of insulating layers (210, 231, and 232). In some exemplary embodiments, the driving element layer 200 may further include wires, electrodes, and thin-film transistors (TFTs) for driving the display device 1. Examples include one or more scan signal lines SL, one or more data signal lines DL, one or more driving voltage lines PL, and one or more switching transistor TR2 for each pixel.

In an exemplary embodiment, the driving transistor TR1 may include a gate electrode G serving as a control electrode, a drain electrode D serving as an input electrode, a first source electrode S1 serving as a first output electrode, a second source electrode S2 serving as a second output electrode, and an active layer A which provides a channel. The driving transistor TR1 may provide a current or voltage for driving an OLED in a particular pixel. In an example, the driving transistor TR1 may control the amount of current flowing via a channel area A1 in the active layer A according to a signal applied to the gate electrode G, which is a control electrode. FIG. 3 illustrates an example in which the driving transistor TR1 is a top gate TFT, where the gate electrode G is above the active layer A.

The active layer A may be on the barrier layer 105 and may include a semiconductor material. In an example, the active layer A may include polycrystalline silicon. In one embodiment, the active layer A may include monocrystalline silicon or amorphous silicon or may include an oxide semiconductor or a semiconductor material other than silicon.

The active layer A may include the channel area A1, a drain area A2, and a source area A3. The channel area A1 may be an area in which a path or channel along which electrons or holes move is formed according to a voltage applied to the gate electrode G, which is a control electrode. For example, electrons or holes provided through the drain area A2 move toward the source area A3 through the channel area A1, or electrons or holes provided through the source area A3 move toward the drain area A2 through the channel area A1.

The drain area A2 and the source area A3 may be spaced apart from each other, with the channel area A1 therebetween. The drain area A2 and the source area A3 may have higher electrical conductivity than the channel area A1. In an example, the drain area A2 and the source area A3 may be converted to conductors, for example, by plasma treatment or ion doping. The drain area A2 may be electrically connected to the drain electrode D to which an input signal is applied. The source area A3 may be electrically connected to the first and second source electrodes S1 and S2. The expression "electrically connected" may not only mean that two conductive elements are directly connected, but may also mean that the two conductive elements are connected indirectly, e.g., via one or more other conductive elements therebetween, either all the time or when a switching element (such as at least one TFT) therebetween is operated.

The gate electrode G may be on the active layer A and may overlap with the channel area A1 of the active layer A. The gate electrode G may include, for example, aluminum (Al), molybdenum (Mo), copper (Cu), or an alloy thereof. The gate electrode G may be a single layer or multiple layers. The gate electrode G may be electrically connected to the output electrode of the switching transistor TR2, which controls the turning on or off of a particular pixel. FIG. 4 illustrates an example in which the gate electrode G of the driving transistor TR1 is directly connected to the output electrode of the switching transistor TR2. In one embodiment, one or more TFTs may be further disposed on a path from the output electrode of the switching transistor TR2 to the gate electrode G of the driving transistor TR1. The control electrode and the input electrode of the switching transistor TR2 may be electrically connected to the scan signal line SL and the data signal line DL, respectively. The switching transistor TR2 may be turned on or off by a control signal provided via the scan signal line SL.

A gate insulating film 210 may be between the active layer A and the gate electrode G and may insulate the active layer A and the gate electrode G from each other. The gate insulating film 210 may include, for example, an inorganic insulating material, e.g., silicon nitride, silicon oxide, silicon nitride oxide, or silicon oxynitride.

An interlayer insulating film 230 may be on the gate electrode G to insulate the gate electrode G from elements above the gate electrode G. In an exemplary embodiment, the interlayer insulating film 230 may be a stack of first and second interlayer insulating films 231 and 232.

The first interlayer insulating film 231 may include an inorganic insulating material, e.g., silicon nitride, silicon oxide, silicon nitride oxide, or silicon oxynitride. The first interlayer insulating film 231 may be directly on the gate electrode G and may cover the gate electrode G. The second interlayer insulating film 232 may be on the first interlayer insulating film 231 and, for example, may include an inorganic insulating material or an organic insulating material.

In some exemplary embodiments, a capacitor electrode 270 may be between the first and second interlayer insulating films 231 and 232. The capacitor electrode 270 may overlap with the gate electrode G in the third direction Z and, thus, may form a storage capacitor Cst together with the gate electrode G. For example, the gate electrode G and the capacitor electrode 270 may form first- and second-side electrodes of the storage capacitor Cst. In one embodiment, the capacitor electrode 270 may overlap with a second capacitor electrode that is electrically connected to the gate electrode G, but not with the gate electrode G, and, thus, may form a storage capacitor together with the second capacitor electrode. The capacitor electrode 270 may include, for example, A1, Mo, Cu, or an alloy thereof.

Through holes (e.g., a drain through hole DH and a first source through hole SH1) may be in the gate insulating film 210 and the interlayer insulating film 230 to partially expose the active layer A. In an example, the drain through hole DH may penetrate the gate insulating film 210 and the interlayer insulating film 230 to at least partially expose the drain area A2 of the active layer A. In an example, the first source through hole SH1 may penetrate the gate insulating film 210 and the interlayer insulating film 230 to at least partially expose a surface (e.g., in FIG. 3, the top surface) of the source area A3 of the active layer A. The drain through hole DH and the first source through hole SH1 may be formed, for example, by partially patterning the gate insulating film 210 and the interlayer insulating film 230.

The drain electrode D and the first source electrode S1 may be on the interlayer insulating film 230. The drain electrode D may be inserted in the drain through hole DH and may be electrically connected to the drain area A2 of the active layer A. In an example, the drain electrode D may be in direct contact with the drain area A2 of the active layer A. The first source electrode S1 may be inserted in the first source through hole SH1 and may be electrically connected to the source area A3 of the active layer A. In an example, the first source electrode S1 may be in direct contact with the source area A3 of the active layer A. The drain electrode D may be electrically connected to the driving voltage line PL, and the first source electrode S1 may be electrically connected to the first OLED OLED1.

FIG. 4 illustrates a circuit embodiment of a pixel, which, for example, may be representative of the pixels in display device 1. Referring to FIG. 1, the drain electrode D of the driving transistor TR1 is directly connected to the driving voltage line PL, and the first source electrode S1 is directly connected to the first OLED OLED1. In one embodiment, one or more TFTs may be further provided on a path from the driving voltage line PL to the drain electrode D of the driving transistor TR1, or a path from the first source electrode S1 of the driving transistor TR1 to the first OLED OLED1.

A first planarization layer 251 may be on the driving element layer 200 to protect wires, lines, electrodes, and TFTs for driving the display device 1. Examples include a scan signal line SL, a data signal line DL, a driving voltage line PL, and/or the switching transistor TR2. The first planarization layer 251 may planarize elements stacked on the first surface (e.g., in FIG. 3, the top surface) of the supporting substrate 100. The first planarization layer 251 may be a single layer or a stack of multiple layers. In an example, the first planarization layer 251 may include an organic material, e.g., an acrylic resin, an epoxy resin, a PI resin, or a polyester (PS) resin or an inorganic insulating material.

The first OLED OLED1 may be on the first planarization layer 251, and may include a first anode 11 facing a first cathode 12 and a first organic light-emitting layer 13 between the first anode 11 and the first cathode 12. The first OLED OLED1 may define the first pixel PX1 of the first display area DA1. For example, light emitted by the first OLED OLED1 may be directed toward the first surface (e.g., the front surface in FIG. 1 and the top surface in FIG. 3) of the display device 1 and may define the first pixel PX1 of the first display area DA1, which emits light of a first (e.g., red) color.

The first anode 11 may be on the first planarization layer 251 and may be electrically connected to the first source electrode S1 via a through hole that penetrates the first planarization layer 251. The first anode 11 may have a higher work function than the first cathode 12. The first anode 11 may be a transparent electrode, an opaque electrode, or a stack of a transparent electrode and an opaque electrode. When the first anode 11 is a transparent electrode, the first anode 11 may include, for example, indium tin oxide (ITO), indium zinc oxide (IZO), zinc oxide, or indium oxide. When the first anode 11 is an opaque electrode, the first anode 11 may include, for example, lithium (Li), aluminum (A1), magnesium (Mg), silver (Ag), nickel (Ni), or chromium (Cr). The first anode 11 may be a pixel electrode in each pixel of the first display area DA1 and may receive a driving signal independently of other pixel electrodes.

The first cathode 12 may be on the first anode 11. In an example, the first cathode 12 and the supporting substrate 100 may be spaced apart from each other, with the first anode 11 therebetween. The first cathode 12 may have a lower work function than the first anode 11. The first anode 11 and the first cathode 12 may be spaced apart from each other, with the first organic light-emitting layer 13 therebetween, and may drive the first OLED OLED1 together. Like the first anode 11, the first cathode 12 may be a transparent electrode, an opaque electrode, or a stack of a transparent electrode and an opaque electrode. The first cathode 12 may be disposed regardless of the distinction between the first and second pixels PX1 and PX2.

The first organic light-emitting layer 13 may be between the first anode 11 and the first cathode 12. The first organic light-emitting layer 13 may generate light by recombining holes and electrons received from the first anode 11 and the first cathode 12. The holes and the electrons may be recombined in the first organic light-emitting layer 13 to generate excitons. Light is emitted when the excitons transition from an excited state to a ground state. In an exemplary embodiment when the first pixel PX1 defined by the first OLED OLED1 emits red color light, the first organic light-emitting layer 13 may emit red light having a peak wavelength of about 610 nm to 650 nm through phosphorescence or fluorescence. A hole control area, an electron control area, a hole blocking area, and/or an electron blocking area may further be provided between the first anode 11 and the first organic light-emitting layer 13 or between the first cathode 12 and the first organic light-emitting layer 13.

In some exemplary embodiments, a first pixel-defining film 310 may be on the first anode 11. The first pixel-defining film 310 may allow the first and third pixels PX1 and PX3 of the first display area DA1 to be distinguished from each other. The first pixel-defining film 310 may have openings that partially expose the surface of the anodes of the first and third pixels PX1 and PX3. For example, in a plan view, the first pixel-defining film 310 may have openings that expose the anodes of the first and third pixels PX1 and PX3. The first organic light-emitting layer 13 and the first cathode 12 may be on the first pixel-defining film 310. The first pixel-defining film 310 may an organic material, e.g., a polyacrylic resin or a PI resin.

A first encapsulation member (or area) 410 may be on the first OLED OLED1 to prevent infiltration of impurities (e.g., moisture, air, etc.) into the display device 1 from the outside and, thus, may prevent the first OLED OLED1 from being damaged by such impurities. For example, the first encapsulation member 410 may encapsulate the first OLED OLED1, e.g., the first organic light-emitting layer 13. In an exemplary embodiment, the first encapsulation member 410 may include a first encapsulation substrate 411 and a first filler 413. The first encapsulation substrate 411 may be a substrate having transparency. In an example, the first encapsulation substrate 411 may include, for example, a glass material or a quartz material. In another example, the first encapsulation substrate 411 may be a thin-film metal substrate. The first filler 413 may fill the space between the first OLED OLED1 and the first encapsulation substrate 411. In an example, the first filler 413 may be an adhesive resin that couples the first encapsulation substrate 411. FIG. 3 illustrates an example in which the first encapsulation member 4100 includes the first encapsulation substrate 411. In one embodiment, the first encapsulation member 410 may include a thin-film encapsulation member in which a layer formed of an inorganic material and a layer formed of an organic material are alternately stacked, or may include both the thin-film encapsulation member and the first encapsulation substrate 411.

A through hole may be formed in the supporting substrate 100 and the barrier layer 105 to partially expose the active layer A. In an example, a second source through hole SH2 may be formed through the supporting substrate 100 and the barrier layer 105 to at least partially expose a second surface (e.g., in FIG. 3, the bottom surface) of the source area A3 of the active layer A.

In an exemplary embodiment, the planar shape of the second source through hole SH2, which penetrates the supporting substrate 100 and the barrier layer 105, may be substantially circular. The second source through hole SH2 may be tapered from the second surface (e.g., in FIG. 3, the bottom surface) to the first surface (e.g., in FIG. 3, the top surface) of the supporting substrate 100. For example, the diameter of the second source through hole SH2 may gradually decrease from the second surface to the first surface of the supporting substrate 100. The second source through hole SH2 may be formed, for example, by removing part of the supporting substrate 100 and part of the barrier layer 105 using a laser.

The second source electrode S2 may be on the second surface (e.g., in FIG. 3, the bottom surface) of the supporting substrate 100. The second source electrode S2 may be inserted in the second source through hole SH2 and may be electrically connected to the source area A3 of the active layer A. In an example, the second source electrode S2 may be in direct contact with the source area A3 of the active layer A. The second source electrode S2 may be electrically connected to the second OLED OLED2. The second source electrode S2 may partially overlap with the first source electrode S1 in the third direction Z.

FIG. 4 illustrates an example in which the second source electrode S2 is directly connected to the second OLED OLED2. In one embodiment, one or more TFTs may be further disposed on a path from the second source electrode S2 of the driving transistor TR1 to the second OLED OLED2.

A second planarization layer 252 may be on the second source electrode S2 to planarize the second surface of the supporting substrate 100. The second planarization layer 252 may be a single layer or a stack of multiple layers. The second planarization layer 252 may include a material which is the same as or different from a material of the first planarization layer 251. In one embodiment, the second planarization layer 252 may be omitted.

The second OLED OLED2 may be on the second planarization layer 252 and may include a second anode 21 facing a second cathode 22 and a second organic light-emitting layer 23 between the second anode 21 and the second cathode 22. The second OLED OLED2 may define the second pixel PX2 of the second display area DA2. For example, light emitted by the second OLED OLED2 may be directed toward the second surface (e.g., the rear surface in FIG. 1 and the bottom surface in FIG. 3) of the display device 1 and may define the second pixel PX2 of the second display area DA2, which emits first (e.g., red) light. Thus, the first pixel PX1 of the first display area DA1 and the second pixel PX2 of the second display area DA2 may be pixels displaying substantially the same color.

The second anode 21 may be on the second planarization layer 252 and may be electrically connected to the second source electrode S2 via a through hole that penetrates the second planarization layer 252. The second anode 21 may have the same structure as the first anode 11 and/or may include the same material as the first anode 11. The second anode 21 may be a pixel electrode, in each pixel of the second display area DA2, that receives a driving signal independently of other pixel electrodes.

The second cathode 22 may be on the second anode 21. In an example, the second cathode 22 and the supporting substrate 100 may be spaced apart from each other, with the second anode 21 therebetween. The second cathode 22 may have the same structure as the second anode 21 and/or may include the same material as the second anode 21. The second cathode 22 may be disposed regardless of the distinction between the second and fourth pixels PX2 and PX4.

The second organic light-emitting layer 23 may be between the second anode 21 and the second cathode 22, and emits light based on a recombination of holes and electrons from the second anode 21 and the second cathode 22.

In an exemplary embodiment, the second organic light-emitting layer 23 may emit light of substantially the same color as the first organic light-emitting layer 13. In an exemplary embodiment where the second pixel PX2 defined by the second OLED OLED2 emits red color light, the second organic light-emitting layer 23 may emit red light having a peak wavelength of about 610 nm to 650 nm through phosphorescence or fluorescence. The second OLED OLED2 may partially overlap with the first OLED OLED1. In an example, the first and third organic light-emitting layers 13 and 23 may partially overlap with each other in the third direction Z.

In an exemplary embodiment, when an input signal is applied via the drain electrode D, which is the input electrode of the driving transistor TR1, the amount of current flowing through the first source electrode S1 (which is the first output electrode of the driving transistor TR1) and the amount of current flowing through the second source electrode S2 (which is the second output electrode of the driving transistor TR1) may be substantially the same. For example, current provided by the driving voltage line PL and flowing through the channel area A1 may be divided substantially equally between the first and second OLEDs OLED1 and OLED2". A voltage ELVSS1 supplied to the first cathode 12 and a voltage ELVSS2 supplied to the second cathode 22 may be the same or different.

The display device 1 includes the first OLED OLED1 and the second OLED OLED2. The first OLED OLED1 emits light that contributes to the display of an image in the first display area DA1 at the front of the display device 1. The second OLED OLED2 emits light that contributes to the display of an image in the second display area DA2 at the rear of the display device 1. In one embodiment, the first and second OLEDs OLED1 and OLED2" may overlap with each other in the third direction Z and may receive a driving signal from the same driving transistor, e.g., the driving transistor TR1. Since the first and second OLEDs OLED1 and OLED2 are electrically connected to the driving transistor TR1 (and particularly to the source area A3 in the active layer A of the driving transistor TR1), the first and second OLEDs OLED1 and OLED2" may both be controlled by a single input signal.

Since a plurality of driving transistors are not needed to drive a plurality of OLEDs, the structure of the display device 1 may be simplified and power consumption of the display device 1 may be reduced. Also, deterioration of resolution may be prevented by reducing or minimizing the area occupied by driving transistors and the like. Also, since the first OLED OLED1 of the first pixel PX1 of the first display area DA1 and the second OLED OLED2 of the second pixel PX2 of the second display area DA2 may be controlled at the same time, two substantially identical images may be displayed in the first and second display areas DA1 and DA2 at the same time, almost without causing any error or time delay therebetween.

In addition, since light emitted by the first OLED OLED1 and light emitted by the second OLED OLED2 may contribute to the display of images in the first and second display areas DA1 and DA2, respectively, without the aid of an additional reflective member, the display quality (such as luminance, contrast, or the like) of the display device 1 may be improved. Also, a double-sided display device may be realized without experiencing a reduction in resolution by disposing the first and second OLEDs OLED1 and OLED2 to overlap with each other in the third direction Z.

A hole control area, an electron control area, a hole blocking area, and/or an electron blocking area may be further interposed between the second anode 21 and the second organic light-emitting layer 23 or between the second cathode 22 and the second organic light-emitting layer 23.

In some exemplary embodiments, a second pixel-defining film 320 may be on the second anode 21. The second pixel-defining film 320 may allow the second and fourth pixels PX2 and PX4 of the second display area DA2 to be distinguished from each other. The second pixel-defining film 320 may have an opening that partially exposes the surface of the second anode 21. The second pixel-defining film 320 may have the same structure as the first pixel-defining film 310 and/or may include the same material as the first pixel-defining film 310.

A second encapsulation member 420 may be on the second OLED OLED2 and, like the first encapsulation member 410, may prevent the infiltration of impurities (e.g., moisture, air, etc.) into the display device 1 from the outside and, thus, au prevent the second OLED OLED2 from being damaged by such impurities. In an exemplary embodiment, the second encapsulation member 420 may include a second encapsulation substrate 421 and a second filler 423. The second encapsulation substrate 421 may include the same material as the first encapsulation substrate 411, and the second filler 423 may include the same material as the first filler 413. In one embodiment, the second encapsulation member 420 may include a thin-film encapsulation member in which a layer formed of an inorganic material and a layer formed of an organic material are alternately stacked, or may include both the thin-film encapsulation member and the second encapsulation substrate 421.

In an exemplary embodiment, the display device 1 may further include the third and fourth OLEDs OLED3 and OLED4. The third OLED OLED3 may be on the first planarization layer 251 and may define the third pixel PX3. For example, light emitted by the third OLED OLED3 may be directed toward the first surface (e.g., the front surface in FIG. 1 and the top surface in FIG. 3) of the display device 1 and may define the third pixel PX3 of the first display area DA1, which emits light of a second color (e.g., a green color). Thus, the first and third pixels PX1 and PX3 of the first display area DA1 may be pixels emitting different colors of light.

The third OLED OLED3 may include a third anode 31 facing a third cathode 32 and a third organic light-emitting layer 33 between the third anode 31 and the third cathode 32. In the third organic light-emitting layer 33, holes and electrons from the third anode 31 and the third cathode 32, respectively, recombine to generate light.

In an exemplary embodiment, the third organic light-emitting layer 33 may emit light of a different color from the first organic light-emitting layer 13. In an exemplary embodiment where the third pixel PX3 defined by the third OLED OLED3 emits green color light, the third organic light-emitting layer 33 may emit green light having a peak wavelength of about 510 nm to 570 nm through phosphorescence or fluorescence. In one embodiment, the third pixel PX3 may emit blue color light, and the third organic light-emitting layer 33 may emit blue light having a peak wavelength of about 430 nm to 470 nm through phosphorescence or fluorescence.

The fourth OLED OLED4 may be on the second planarization layer 252 and may define the fourth pixel PX4. Light emitted by the fourth OLED OLED4 may be directed toward the second surface (e.g., the rear surface in FIG. 1 and the bottom surface in FIG. 3) of the display device 1 and may define the fourth pixel PX4 of the second display area DA2, which emits the second (e.g., green) color of light. Thus, the third pixel PX3 of the first display area DA1 and the fourth pixel PX4 of the second display area DA2 may emit the same color of light.

The fourth OLED OLED4 may include a fourth anode 41 facing a fourth cathode 42 and a fourth organic light-emitting layer 43 between the fourth anode 41 and the fourth cathode 42. In the fourth organic light-emitting layer 43, holes and electrons from the fourth anode 41 and the fourth cathode 42, respectively, recombine to generate light.

In an exemplary embodiment, the fourth organic light-emitting layer 43 may emit light of substantially the same color as the third organic light-emitting layer 33. In an exemplary embodiment where the fourth pixel PX4 defined by the fourth OLED OLED4 emits green color light, the fourth organic light-emitting layer 43 may emit green light having a peak wavelength of about 510 nm to 570 nm through phosphorescence or fluorescence. In one embodiment, the fourth pixel PX4 may emit blue color light, and the fourth organic light-emitting layer 43 may emit blue light having a peak wavelength of about 430 nm to 470 nm through phosphorescence or fluorescence. The fourth OLED OLED4 may partially overlap with the third OLED OLED3. In an example, the third organic light-emitting layer 33 may partially overlap with the fourth organic light-emitting layer 43 in the third direction Z.

As described above, in the display device 1, both of the first OLED OLED1 of the first display area DA1 and the second OLED OLED2 of the second display area DA2 may be controlled by a single input signal. Accordingly, substantially the same information may be simultaneously provided to a viewer who views the display device 1 from the side of the first display area DA1 and a viewer who views the display device 1 from the side of the second display area DA2. In an example, an image displayed in the first display area DA1 and an image displayed in the second display area DA2 may be substantially the same with no error or time delay therebetween, except that they are reversed from each other.

Figure 5:
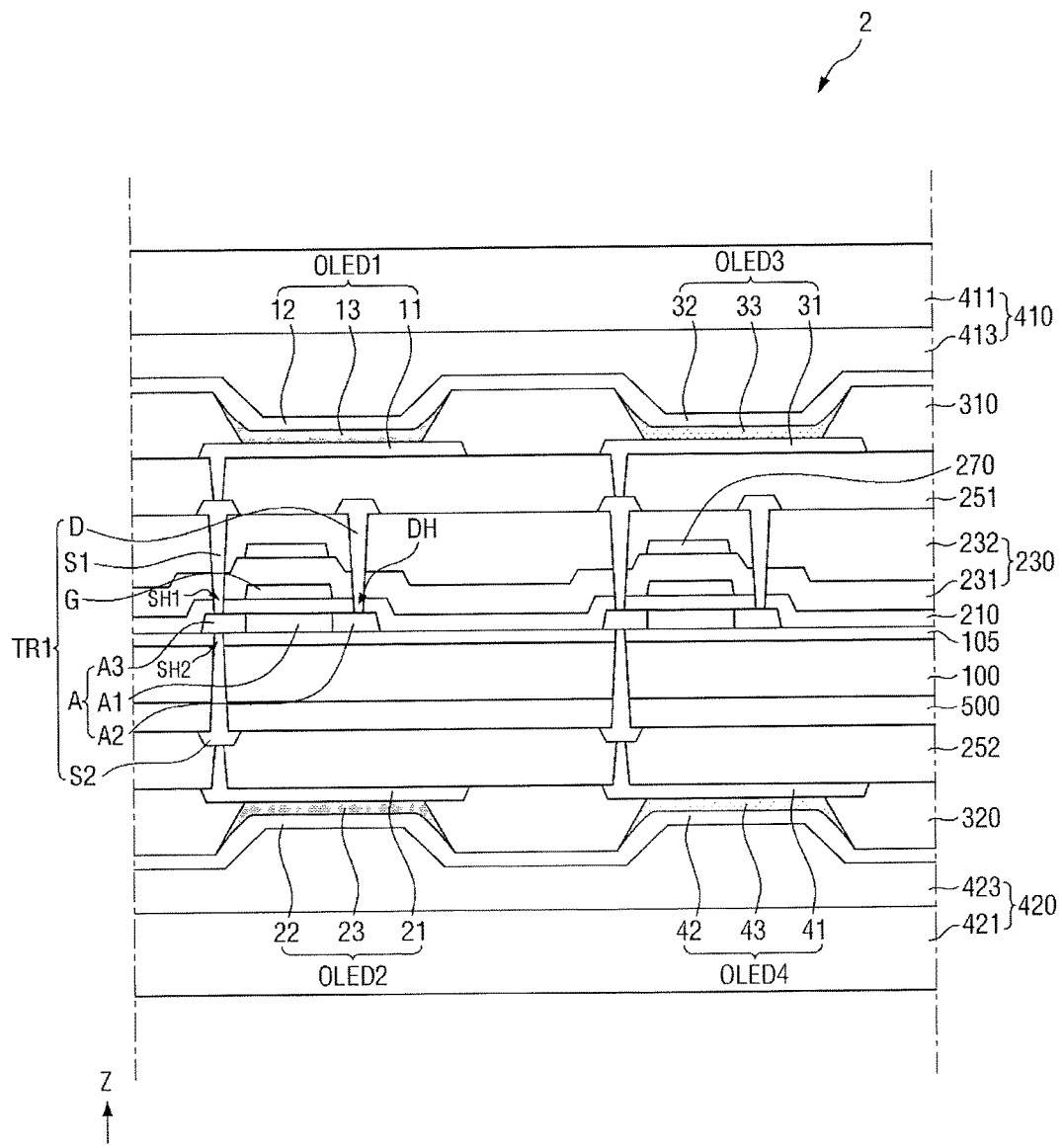
FIG. 5 illustrates another embodiment of a display device.

FIG. 5 illustrates a cross-sectional view of another embodiment of a display device 2. The display device 2 may differ from the display device 1 of FIG. 1 in that it further includes a thickness control layer 500 between a supporting substrate 100 and a second planarization layer 252.

In an exemplary embodiment, the thickness control layer 500 may be on a second surface (e.g., the bottom surface in FIG. 5) of the supporting substrate 100. The thickness control layer 500 may be disposed directly on the supporting substrate 100. The thickness control layer 500 may include an organic material and an inorganic insulating material and may have a predetermined thickness.

A second source through hole SH2 may be formed to penetrate not only the supporting substrate 100 and a barrier layer 105, but also the thickness control layer 500. In an example, the second source through hole SH2 may penetrate the thickness control layer 500, the supporting substrate 100, and the barrier layer 105 and, thus, may at least partially expose a second surface (e.g., the bottom surface in FIG. 5) of a source area A3 of an active layer A. A second source electrode S2 may be inserted in the second source through hole SH2 and may be electrically connected to the source area A3 of the active layer A.

The display device 2 may control the length or depth of the second source through hole SH2, into which the second source electrode S2 is inserted, using the thickness control layer 500. Accordingly, the relatively amounts of current flowing through a first source electrode S1 and the second source electrode S2 may be easily controlled. As a result, the display qualities of images displayed in first and second display areas (e.g., luminances of the images) may be equalized.

Figure 6:
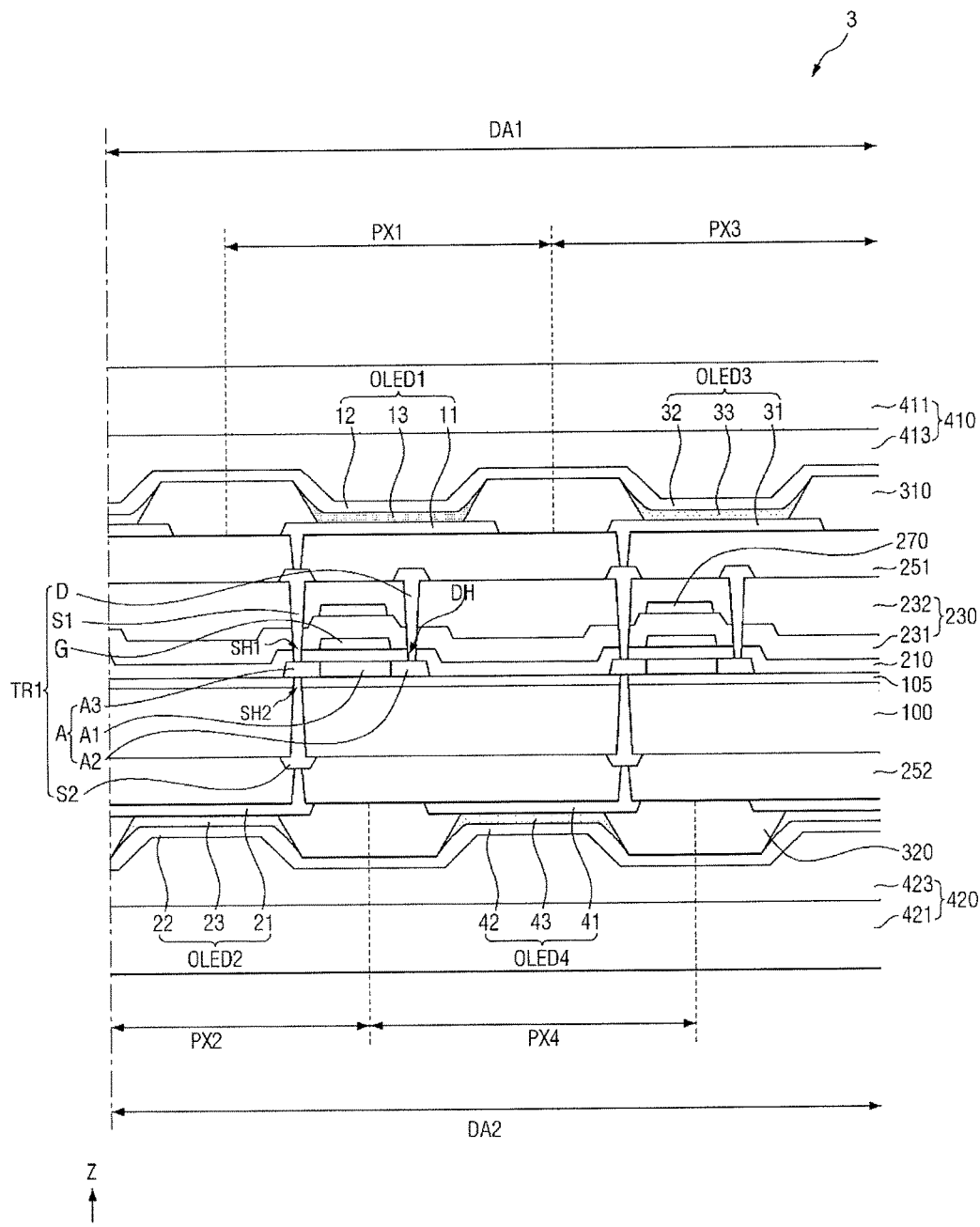
FIG. 6 illustrates another embodiment of a display device.

FIG. 6 illustrates a cross-sectional view of another embodiment of a display device 3. The display device 3 may differ from the display device 1 of FIG. 1 in that first and second anodes 11 and 21 of first and second OLEDs OLED1 and OLED2 extend in different directions and third and fourth anodes 31 and 41 of third and fourth OLEDs OLED3 and OLED4 extend in different directions.

In an exemplary embodiment, both of the first and second anodes 11 and 21 may be electrically connected to a source area A3 of an active layer A, but may extend in different directions. In an example, a first pixel PX1 in a first display area DA1 defined by the first OLED OLED1 and a second pixel PX2 in a second display area DA2 defined by the second OLED OLED2 may partially overlap with each other. For example, the second pixel PX2 of the second display area DA2 may be shifted in a plan view to partially overlap even with a pixel adjacent to the first pixel PX1 of the first display area DA1.

Similarly, in an exemplary embodiment, both of the third and fourth anodes 31 and 41 may be electrically connected to the source area A3 of the active layer A, but may extend in different directions. In an example, a third pixel PX3 of the first display area DA1 defined by the third OLED OLED3 and a fourth pixel PX2 of the second display area DA2 defined by the fourth OLED OLED4 may partially overlap with each other. For example, the fourth pixel PX4 of the second display area DA2 may be shifted in a plan view to partially overlap even with the first pixel PX1 of the first display area DA1.

In a non-limiting example, the first anode 11 of the first OLED OLED1 of the first pixel PX1 (which emits a first color (e.g., red) of light in the first display area DA1) may partially overlap with the fourth anode 41 of the fourth OLED OLED4 of a fourth pixel PX4, which emits a second color (e.g., green) of light different from the first color in the second display area DA2.

In the display device 3, both of the first and second OLEDs OLED1 and OLED2 of the first and second display areas DA1 and DA2 may be controlled by a single input signal, but a plurality of pixels in the first display area DA1 may be misaligned with a plurality of pixels in the second display area DA2. As a result, the planar position of a first display surface formed by the first display area DA1 and the planar position of a second display surface formed by the second display area DA2 may be different from each other. As a result, examples of the display device 3 may be diversely configured to meet, for example, any one of a variety of intended applications.

Figure 7:
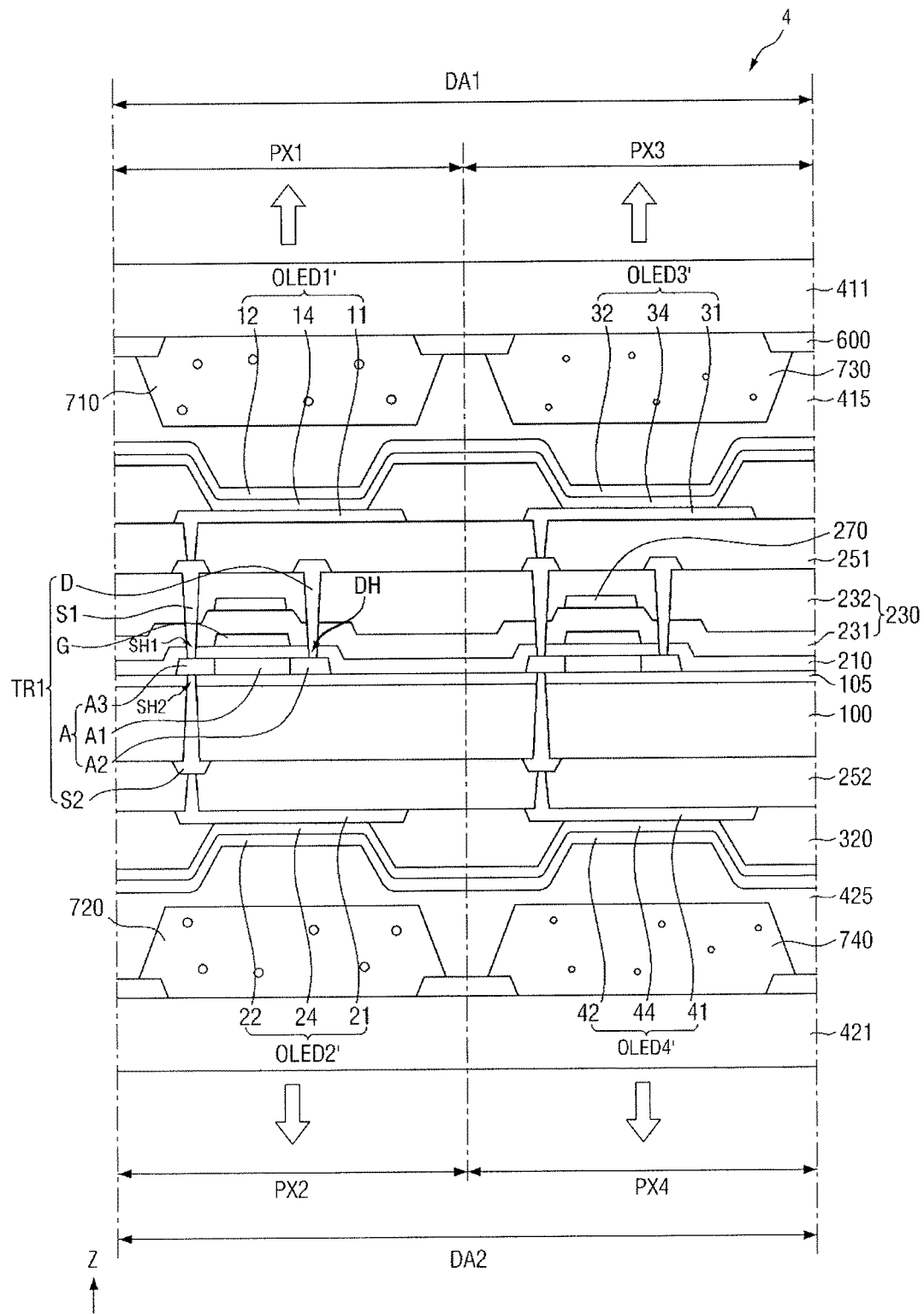
FIG. 7 illustrates another embodiment of a display device.

FIG. 7 illustrates a cross-sectional view of another embodiment of a display device 4. The display device 4 may differ from the display device 1 of FIG. 1 in that it further includes color conversion patterns.

In an exemplary embodiment, first, second, third, and fourth OLEDs OLED1', OLED2', OLED3', and OLED4' may emit light of the same color. The first, second, third, and fourth OLEDs OLED1', OLED2', OLED3', and OLED4' may all emit, for example, blue light having a peak wavelength of about 430 nm to 470 nm through phosphorescence or fluorescence. In an example, first and third organic light-emitting layers 14 and 34 may be formed in one integral body without any physical boundary therebetween and may be disposed without being able to distinguish between first and third pixels PX1 and PX3. Second and fourth organic light-emitting layers 24 and 44 may be formed in one integral body without any physical boundary therebetween and may be disposed without being able to distinguish between second and fourth pixels PX2 and PX4.

A first color conversion pattern 710 may be on a first surface (e.g., the top surface in FIG. 7) of the first OLED OLED1'. A second color conversion pattern 720 may be on a second surface (e.g., the bottom surface in FIG. 7) of the second OLED OLED2'. A third color conversion pattern 730 may be on a first surface of the third OLED OLED3'. A fourth color conversion pattern 740 may be on a second surface of the fourth OLED OLED4'.

The first color conversion pattern 710 may be at a location corresponding to a first pixel PX1 in a first display area DA1 and may convert the color of light emitted by the first OLED OLED1'. The second color conversion pattern 720 may be at a location corresponding to a second pixel PX2 in a second display area DA2 and may convert the color of light emitted by the second OLED OLED2'. The third color conversion pattern 730 may be at a location corresponding to a third pixel PX3 of the first display area DA1 and may convert the color of light emitted by the third OLED OLED3'. The fourth color conversion pattern 740 may be at a location corresponding to a fourth pixel PX4 of the second display area DA2 and may convert the color of light emitted by the fourth OLED OLED4'.

In an exemplary embodiment, the first, second, third, and fourth color conversion patterns 710, 720, 730, and 740 may include a material that converts or shifts the peak wavelength of light incident thereupon to another particular wavelength, e.g., a wavelength shift material. The wavelength shift material may absorb light emitted by the first, second, third, and fourth OLEDs OLED1', OLED2', OLED3', and OLED4', for example, blue light, and may emit light having a different wavelength band from blue light. In an example, the wavelength shift material may be a quantum dot material or a phosphor material. In an example, the quantum dot material may emit a particular color based on the transition of electrons thereof from a conduction band to a valence band.

The quantum dot material may have a core-shell structure. The core of the quantum dot material may be, for example, a semiconductor nanocrystalline material. Examples of the core of the quantum dot material include silicon (S1) nanocrystals, Group II-VI compound nanocrystals, and Group III-V compound nanocrystals.

In an exemplary embodiment where the first pixel PX1 of the first display area DA1 and the second pixel PX2 of the second display area DA2 both emit red color light, the first and second color conversion patterns 710 and 720 absorb light incident thereupon and may emit red light having a peak wavelength of about 610 nm to 650 nm. As a result, the first and second pixels PX1 and PX2 may emit red light.

In an exemplary embodiment where both of the third pixel PX3 of the first display area DA1 and the fourth pixel PX4 of the second display area DA2 emit green color light, the third and fourth color conversion patterns 730 and 740 absorb light incident thereupon and may emit green light having a peak wavelength of about 510 nm to 570 nm. As a result, the third and fourth pixels PX3 and PX4 may emit green light.

In another exemplary embodiment, the first, second, third, and fourth color conversion patterns 710, 720, 730, and 740 may be wavelength band filters, e.g., color filters that selectively transmit light of a particular wavelength band therethrough and absorb light of other wavelength bands. The color filters may include a colorant such as a pigment or dye. In an example, the first and second color conversion patterns 710 and 720 may be red color filters selectively transmitting light of a red wavelength band therethrough. The third and fourth color conversion patterns 730 and 740 may be green color filters selectively transmitting light of a green wavelength band therethrough.

In some exemplary embodiments, light-shielding members 600 may be between the first and third pixels PX1 and PX3 of the first display area DA1 and between the second and fourth pixels PX2 and PX4 of the second display area DA2. The light-shielding members 600 may be along the boundaries between pairs of adjacent pixels and may block the transmission of light. In an example, the light-shielding members 600 may be disposed, for example, in substantially a lattice shape in a plan view. The light-shielding members 600 may prevent light emitted from one pixel from infiltrating into other neighboring pixels and, thus, may prevent color mixing.

In the display device 4, color conversion patterns are in pixels to change the color of light incident thereupon, and thus to display various colors. Accordingly, even if all of the first, second, third, and fourth OLEDs OLED1', OLED2', OLED3', and OLED4' emit light of the same color, the display device 4 may have excellent color reproducibility.

Figure 8:
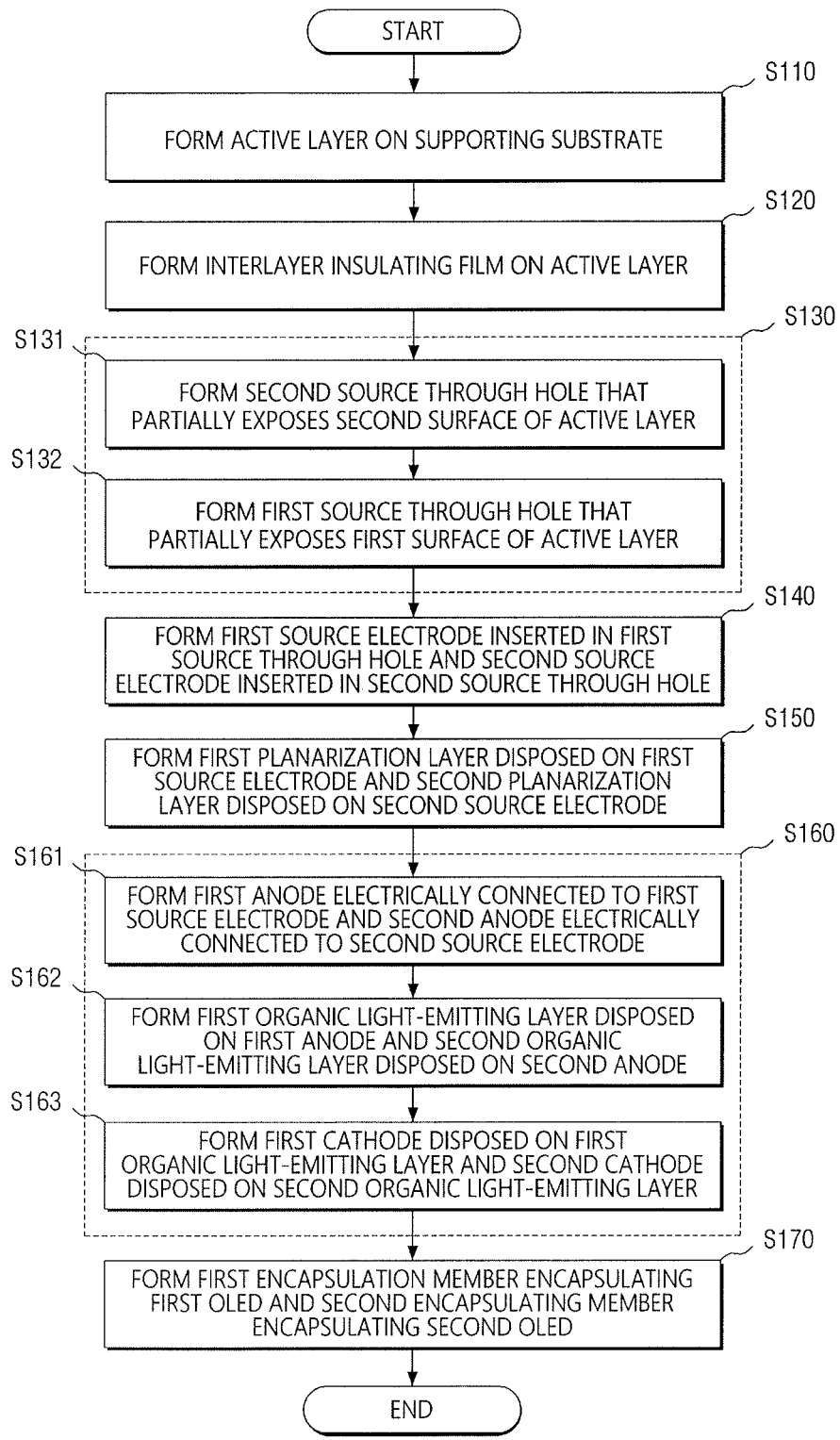
FIG. 8 illustrates an embodiment of a method for manufacturing a display device.

FIG. 8 illustrates an embodiment of a method for manufacturing a display device. Referring to FIG. 8, the method may include forming an active layer on a supporting substrate (S110); forming an interlayer insulating film on the active layer (S120); forming a plurality of through holes (S130); forming a source electrode and a drain electrode (S140); forming first and second planarization layers (S150); forming OLEDs (S160); and forming first and second encapsulation members (S170). Each of the operations of the method of FIG. 8 will hereinafter be described in further detail with reference to FIGS. 9 through 18, which illustrate cross-sectional views of various stages corresponding to the method of FIG. 8.

Figure 9:
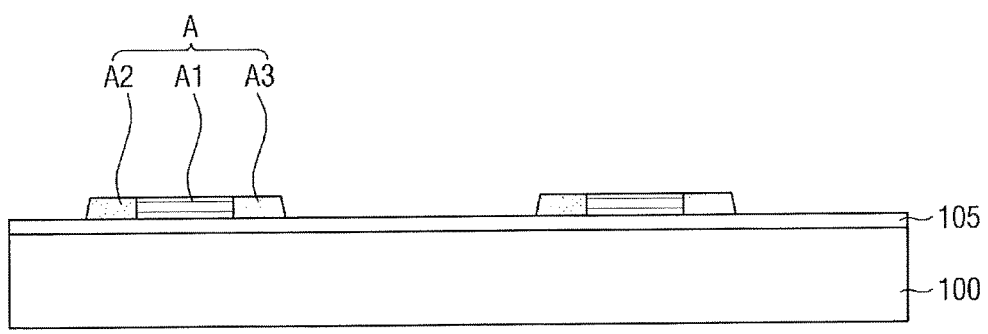
FIGS. 9 to 18 illustrate examples of various stages of the method of FIG. 8.

Referring to FIGS. 8 and 9, a barrier layer 105 is formed on a supporting substrate 100, and an active layer A is formed on the barrier layer 105 (S110). In an exemplary embodiment, S110 may include forming a semiconductor material layer on the barrier layer 105, patterning the semiconductor material layer, and forming a drain area A2 and a source area A3 by treating the patterned semiconductor material layer with plasma or doping the patterned semiconductor material layer with ion impurities. The supporting substrate 100, the barrier layer 105, and the active layer A may correspond to the ones described, for example, with reference to FIG. 3.

Figure 10:
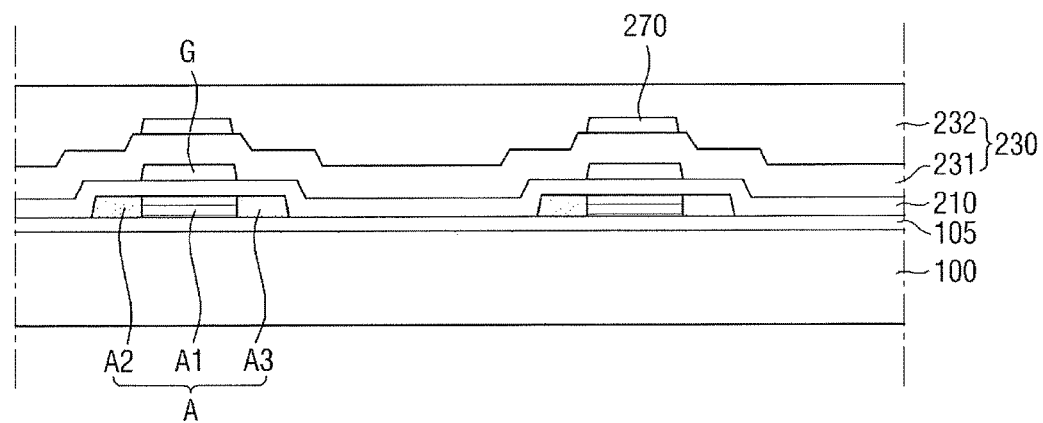
Figure 11:
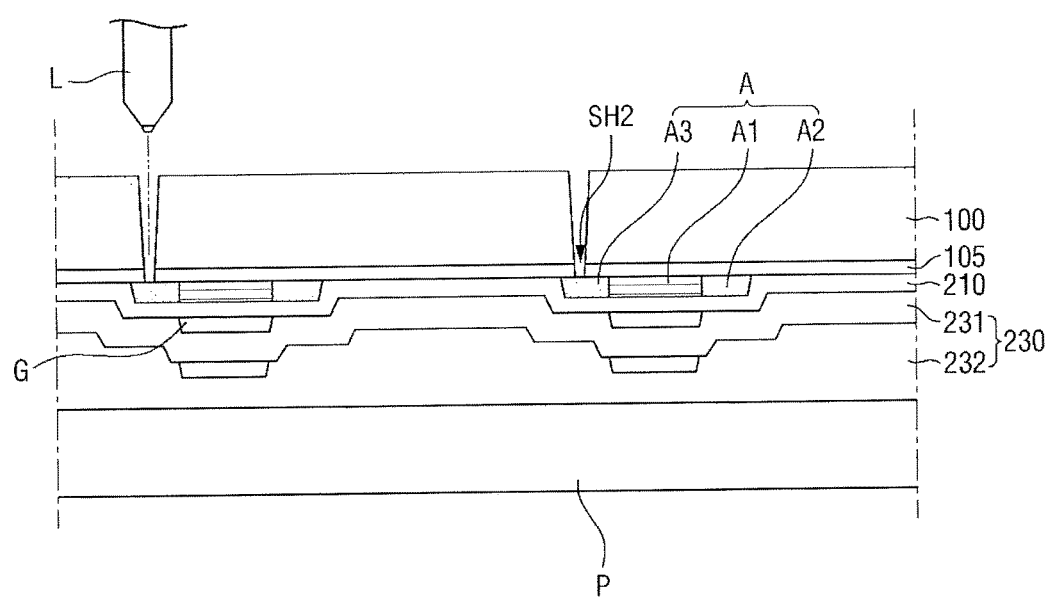
Figure 12:
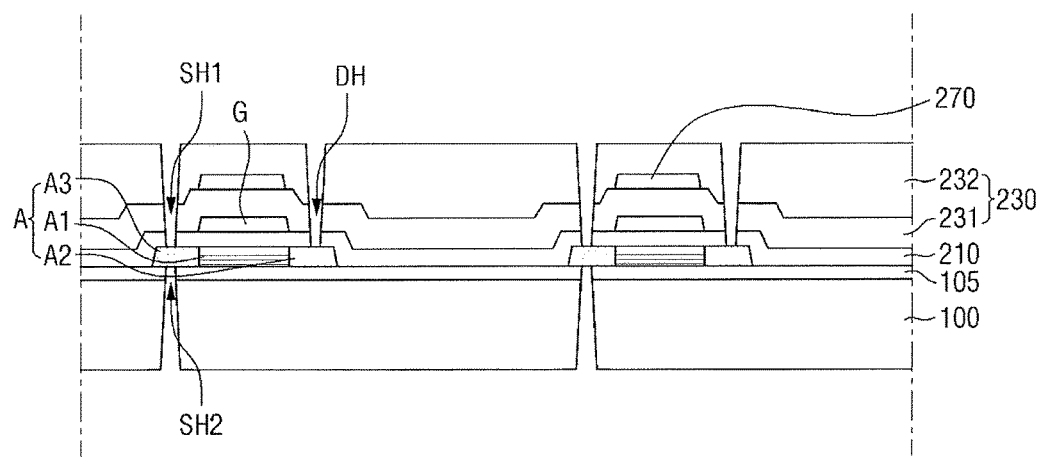
Figure 13:
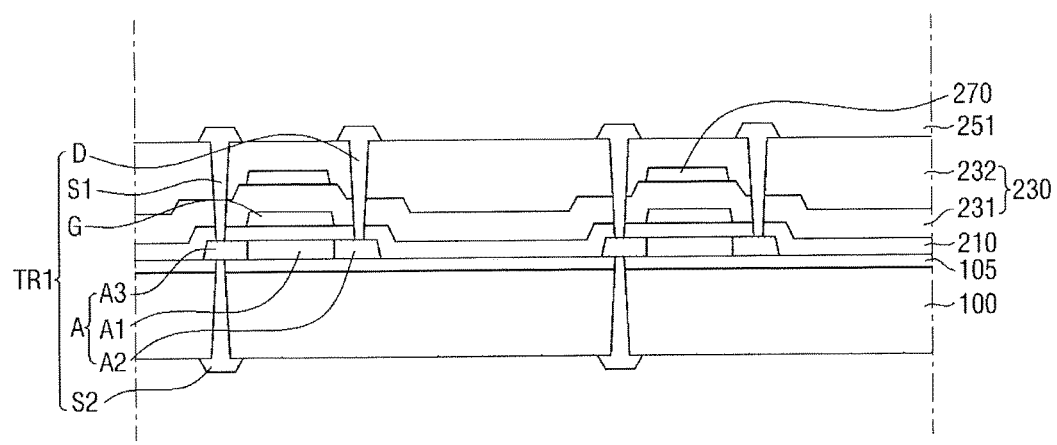
Figure 14:
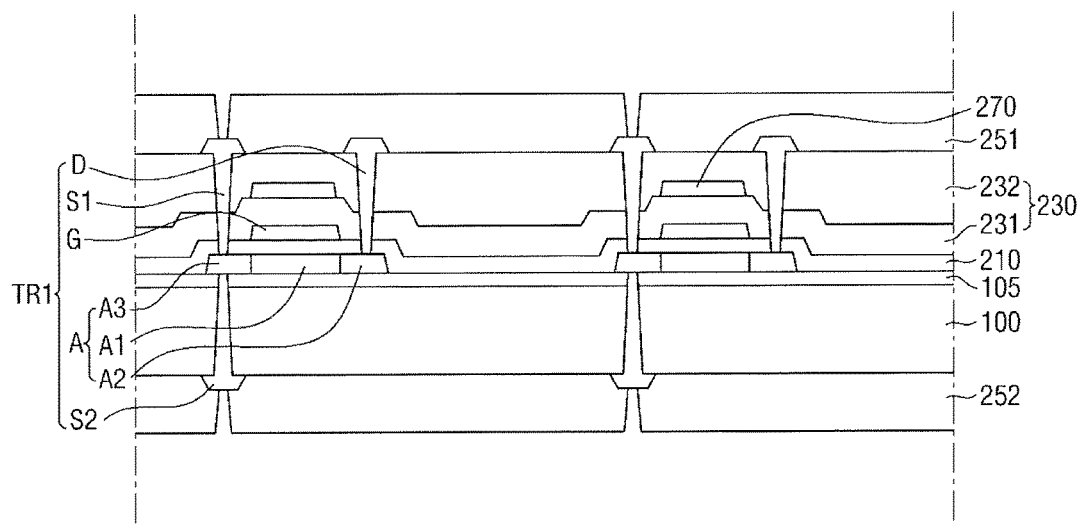

Referring to FIGS. 8 through 10, a gate insulating film 210, a gate electrode G, a capacitor electrode 270, and an interlayer insulating film 230 are formed on the active layer A (S120). In an exemplary embodiment, the interlayer insulating film 230 may include a stack of first and second interlayer insulating films 231 and 232. The gate insulating film 210, the gate electrode G, the capacitor electrode 270, and the interlayer insulating film 230 may correspond to the ones described, for example, with reference to FIG. 3.

Referring to FIGS. 8 through 12, a drain through hole DH, a first source through hole SH1, and a second source through hole SH2 are formed (S130). In an exemplary embodiment, S130 may include forming the second source through hole SH2 (S131) and forming the drain through hole DH and the first source through hole SH1 (S132). Operation S131 may form the second source through hole SH2 from the side of a second surface (e.g., the top surface in FIG. 11) of the supporting substrate 100.

In an exemplary embodiment, S131 may include placing the interlayer insulating film 230 in contact with a processing plate P and forming the second source through hole SH2 using a laser L so as for the source area A3 of the active layer A to be partially exposed. The operation of forming the second source through hole SH2 using the laser L may include removing part of the supporting substrate 100 and removing part of the barrier layer 105. A hole may be formed in the supporting substrate 100 and the barrier layer 105 due to energy generated in each area irradiated with light by the laser L.

The laser L may be, for example, a picosecond laser or a femtosecond laser providing ultrashort pulse or a microwave laser light. By using a ultrashort pulse or a microwave laser, only the supporting substrate 100 and the barrier layer 105 may be selectively removed without causing damage to other elements. Also, a fine through hole having a diameter of about 5 μm or less may be formed in a non-contact manner.

Operation S132 may form the drain through hole DH and the first source through hole SH1 from the side of a first surface (e.g., the top surface in FIG. 12) of the supporting substrate 100. In an exemplary embodiment, operation S132 may include partially patterning the interlayer insulating film 230 and the gate insulating film 210 to partially expose the drain area A2 and the source area A3 of the active layer A. The drain through hole DH and the first source through hole SH1 may be formed at the same time by a single patterning process.

In the method of FIG. 8, the interlayer insulating film 230 in a relatively stable surface state is formed and is then placed on the processing plate P. The second source through hole SH2 may be formed ahead of the drain through hole DH and the first source through hole SH1. Accordingly, damage or contamination may be prevented without an additional carrier substrate, and the second source through hole SH2 may be stably formed.

Referring to FIGS. 8 through 13, a drain electrode D, a first source electrode S1, and a second source electrode S2 are formed (S140). The drain electrode D is inserted in the drain through hole DH and is electrically connected to the drain area A2 of the active layer A. The first source electrode S1 is inserted in the first source through hole SH1 and is electrically connected to a first surface (e.g., the top surfaces in FIG. 13) of the source area A3 of the active layer A. The second source electrode S2 is inserted in the second source through hole SH2 and is electrically connected to a second surface (e.g., the bottom surfaces in FIG. 13) of the source area A3 of the active layer A.

In an exemplary embodiment, operation S140 may include forming conductive metal layers and patterning the conductive metal layers. In an example, the drain electrode D and the first source electrode S1 may be formed on the first surface of the supporting substrate 100. Then, the second source electrode S2 may be formed on the second surface of the supporting substrate 100. In another example, the second source electrode S2 may be formed first, and then the drain electrode D and the first source electrode S1 may be formed.

Referring to FIGS. 8 through 14, a first planarization layer 251 having through holes and a second planarization layer 252 also having through holes are formed (S150). In an exemplary embodiment, the operation of forming the first planarization layer 251 may include forming a planarization layer on the drain electrode D and the first source electrode S1 and partially patterning the planarization layer. In an exemplary embodiment, the operation of forming the second planarization layer 252 may include forming a planarization layer on the second source electrode S2 and partially patterning the planarization layer. In an example, the first planarization layer 251 may be formed on the first surface (e.g., the top surface in FIG. 14) of the supporting substrate 100. Then, the second planarization layer 252 may be formed on the second surface (the bottom surface in FIG. 14) of the supporting substrate 100. In another example, the second planarization layer 252 may be formed first, and then the first planarization layer 251 may be formed.

Referring to FIGS. 8 through 17, first and second OLEDs OLED1 and OLED2 are formed to be electrically connected to the active layer A (S160). The first OLED OLED1 may be electrically connected to the active layer A via the first source electrode S1. The second OLED OLED2 may be electrically connected to the active layer A via the second source electrode S2. In an exemplary embodiment, operation S160 may include forming first and second anodes 11 and 21 (S161), forming first and second organic light-emitting layers 13 and 23 (S162), and forming first and second cathodes 12 and 22 (S163).

Figure 15:
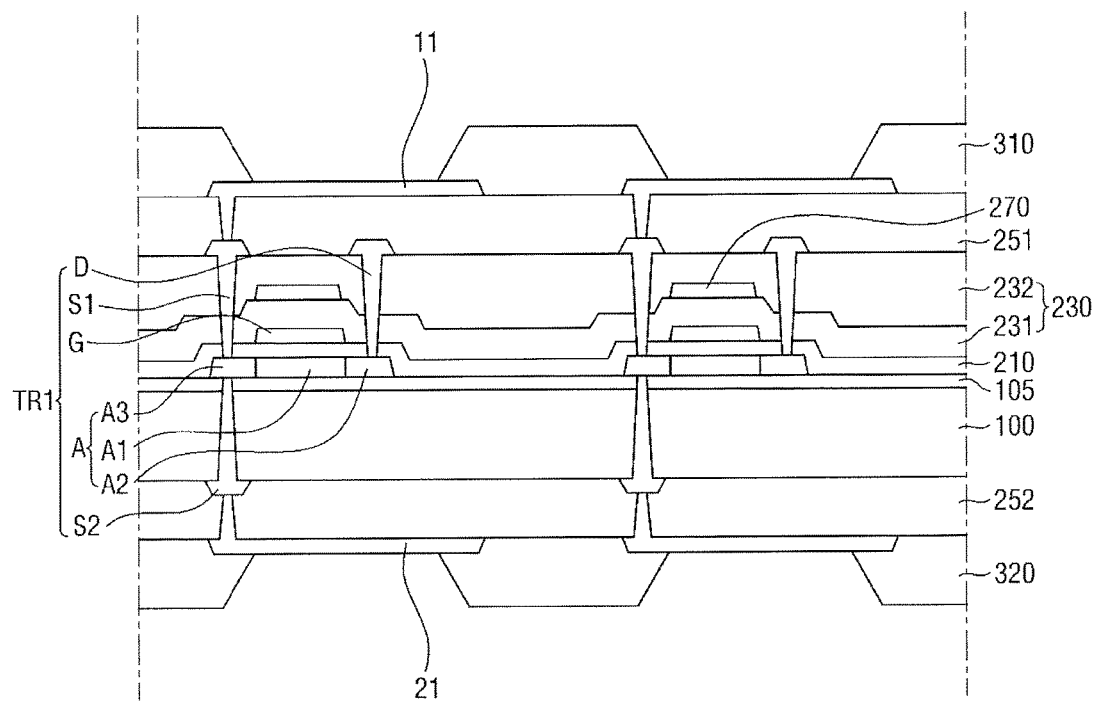

Referring to FIG. 15, the first and second anodes 11 and 21 and first and second pixel-defining films 310 and 320 are formed (S161). Operation S161 may include forming the first and second anodes 11 and 21 and forming the first and second pixel-defining films 310 and 320.

In an exemplary embodiment, the operation of forming the first and second anodes 11 and 21 may include forming conductive metal layers and patterning the conductive metal layers. The first and second anodes 21 may be electrically connected to the source area A3 of the active layer A. In an example, the first anode 11 may be formed on the first surface (e.g., the top surface in FIG. 15) of the supporting substrate 100. Then, the second anode 21 may be formed on the second surface (e.g., the bottom surface in FIG. 15) of the supporting substrate 100. In another example, the second anode 21 may be formed first, and then the first anode 11 may be formed.

The operation of forming the first and second pixel-defining films 310 and 320 may include forming organic material layers and patterning the organic material layers to form openings that partially expose the first and second anodes 11 and 21. In an example, the first pixel-defining film 310 may be formed on the first surface of the supporting substrate 100. Then, the second pixel-defining film 320 may be formed on the second surface of the supporting substrate 100. In another example, the second pixel-defining film 320 may be formed first, and then the first pixel-defining film 310 may be formed.

Figure 16:
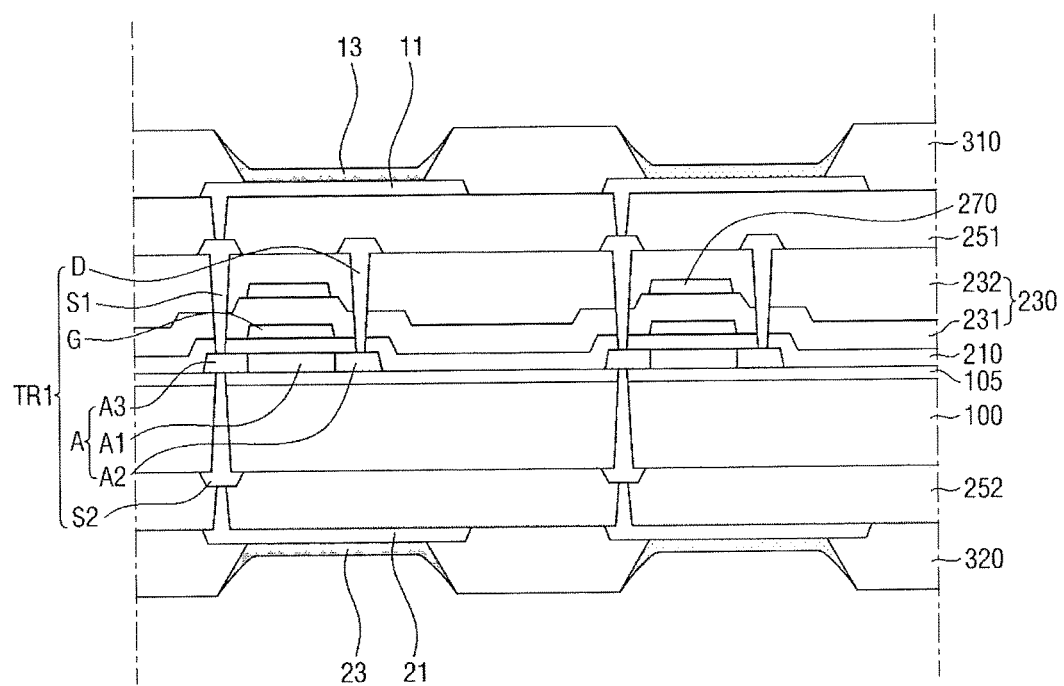

Referring to FIG. 16, the first and second organic light-emitting layers 13 and 23 are formed (S162). Operation S162 may be performed by vacuum deposition or inkjet printing. In an exemplary embodiment, the first organic light-emitting layer 13 may be formed on the first surface (e.g., the top surface in FIG. 16) of the supporting substrate 100. Then, the second organic light-emitting layer 23 may be formed on the second surface (e.g., the bottom surface in FIG. 16) of the supporting substrate 100. In another exemplary embodiment, the second organic light-emitting layer 23 may be formed first, and then the first organic light-emitting layer 13 may be formed.

Figure 17:
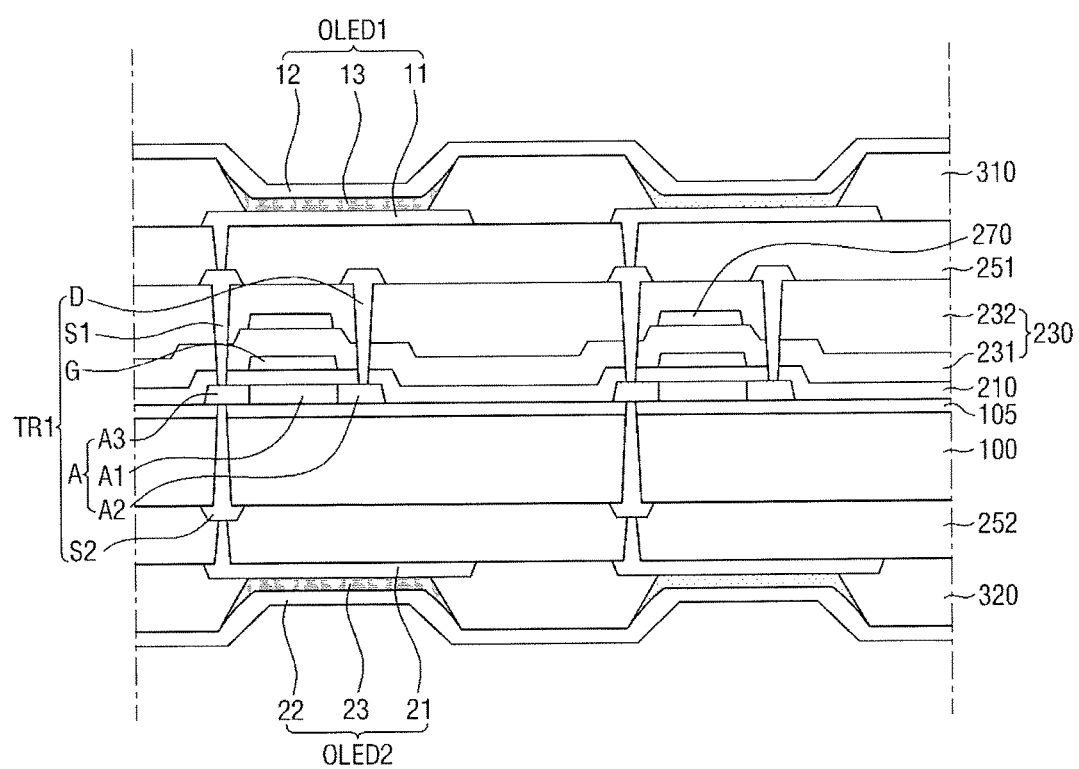
Figure 18:
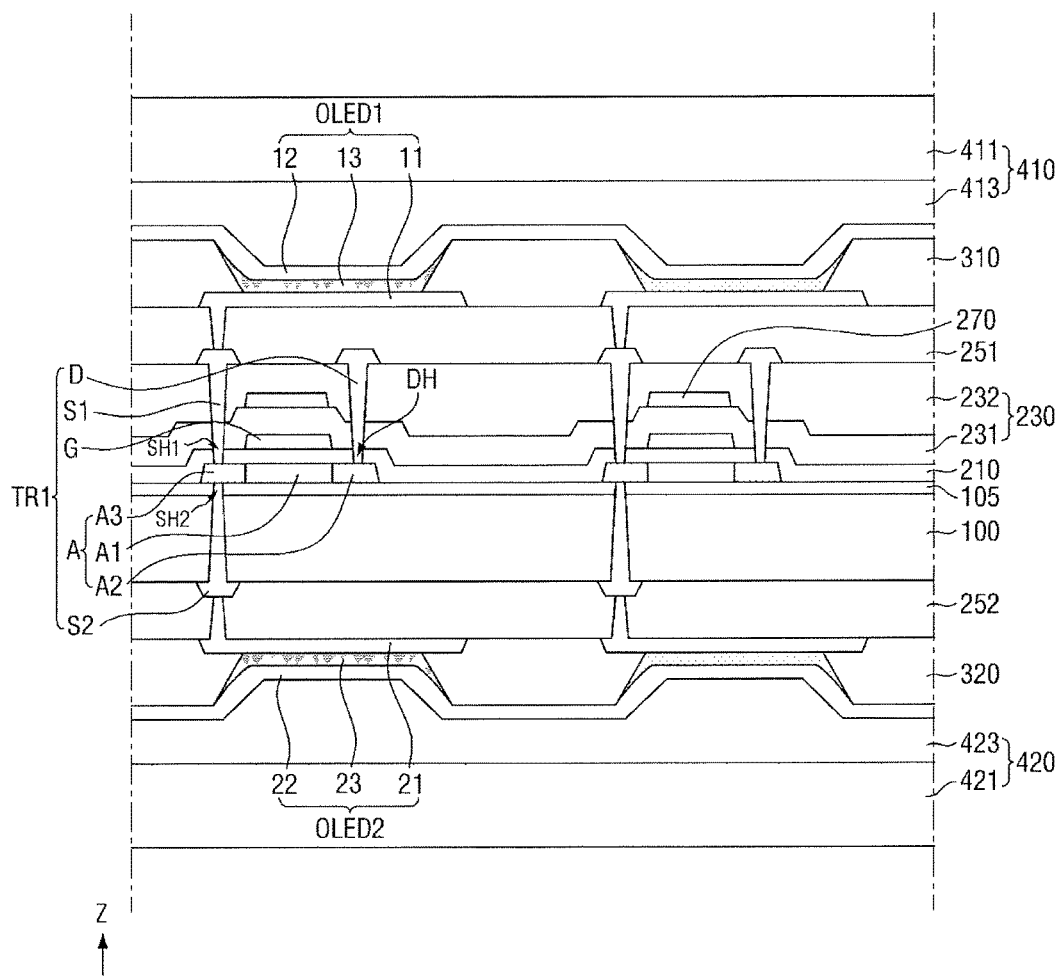

Referring to FIG. 17, the first cathode 12 is formed on the first organic light-emitting layer 13, and the second cathode 22 is formed on the second organic light-emitting layer 23 (S163). In an exemplary embodiment, the first cathode 12 may be formed on the first surface (e.g., the top surface in FIG. 17) of the supporting substrate 100. Then, the second cathode 22 may be formed on the second surface (e.g., the bottom surface in FIG. 17) of the supporting substrate 100. In another exemplary embodiment, the second cathode 22 may be formed first, and then the first cathode 12 may be formed.

Referring to FIGS. 8 through 18, a first encapsulation member 410 is formed on the first cathode 12, and a second encapsulation member (or area) 420 is formed on the second cathode 22 (S170). In an exemplary embodiment, the first encapsulation member 410 may be formed on the first surface (e.g., the top surface in FIG. 18) of the supporting substrate 100. Then, the second encapsulation member 420 may be formed on the second surface (e.g., the bottom surface in FIG. 18) of the supporting substrate 100. In another exemplary embodiment, the second encapsulation member 420 may be formed first, and then the first encapsulation member 410 may be formed. The first and second encapsulation members 410 and 420 may be the ones described, for example, with reference to FIG. 3.

The method according to the exemplary embodiment of FIG. 8 may provide a display device which includes the following features stacked in sequential order on the first surface of the supporting substrate 100: the drain electrode D and the first source electrode S1, the first planarization layer 251, the first anode 11, the first organic light-emitting layer 13, the first cathode 12, and the first encapsulation member 410. The display device may further include the second source electrode S2, the second planarization layer 252, the second anode 21, the second organic light-emitting layer 23, the second cathode 22, and the second encapsulation member 420, which are sequentially stacked on the second surface of the supporting substrate 100.

If elements are sequentially stacked on the first surface of the supporting substrate 100 and elements are sequentially stacked on the second surface of the supporting substrate 100, manufacture of a display device may become complicated because different elements require different processes. However, in the method according to the exemplary embodiment of FIG. 8, elements may be sequentially formed on both surfaces of the supporting substrate 100 within a single chamber by the same processes, i.e., double-sided processes. As a result, manufacture of a display device may be simplified. Also, contamination such as adhesion of impurities may be reduced or minimized by reducing or minimizing the movement of stages. Also, process tact time may be reduced.

In an example, the operation of forming the first source through hole SH1 (e.g., S132) may be performed before the operation of forming the second OLED OLED2. Also, the operation of forming the second source through hole SH2 (e.g., S131) may be performed before the operation of forming the first OLED OLED1. Also, the operation of forming the first source electrode S1 may be performed before the operation of forming the second planarization layer 252. Also, the operation of forming the second source electrode S2 may be performed before the operation of forming the first planarization layer 251. Also, the operation of forming the first planarization layer 251 may be performed before the operation of forming the second OLED OLED2. Also, the operation of forming the second planarization layer 252 may be performed before the operation of forming the first OLED OLED1. Also, the operation of forming the first OLED OLED1 may be performed before the operation of forming the second encapsulation member 42. Also, the operation of forming the second OLED OLED2 may be performed before the operation of forming the first encapsulation member 410.

In one or more embodiments, the operation of forming the first anode 11 may be performed before the operation of forming the second pixel-defining film 320. Also, the operation of forming the second anode 21 may be performed before the operation of forming the first pixel-defining film 310. Also, the operation of forming the first pixel-defining film 310 may be performed before the operation of forming the second organic light-emitting layer 23 Also, the operation of forming the second pixel-defining film 320 may be performed before the operation of forming the first organic light-emitting layer 13. Also, the operation of forming the first organic light-emitting layer 13 may be performed before the operation of forming the second cathode 22. Also, the operation of forming the second organic light-emitting layer 23 may be performed before the operation of forming the first cathode 12.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
   a supporting substrate having first surface and second surfaces;
   a thin-film transistor (TFT) on the first surface of the supporting substrate and including a control electrode, an input electrode, a first output electrode, a second output electrode, and an active layer;
   a first organic light-emitting diode (OLED) on the first surface of the supporting substrate and electrically connected to the first output electrode of the TFT; and
   a second OLED on the second surface of the supporting substrate and electrically connected to the second output electrode of the TFT.

2. The display device as claimed in claim 1, wherein the first output electrode and the second output electrodes are electrically connected to a source area of the active layer.

3. The display device as claimed in claim 1, wherein:
   the first OLED includes a first anode electrically connected to the first output electrode, a first cathode spaced apart from and facing the first anode, and a first organic light-emitting layer between the first anode and the first cathode, and
   the second OLED includes a second anode electrically connected to the second output electrode, a second cathode spaced apart from and facing the second anode, and a second organic light-emitting layer between the second anode and the second cathode, the second organic light-emitting layer to emit the same color light as the first organic light-emitting layer.

4. The display device as claimed in claim 3, wherein the first organic light-emitting layers and the second organic light-emitting layers partially overlap with each other.

5. The display device as claimed in claim 3, wherein:
   the first cathode and the supporting substrate are spaced apart from each other with the first anode therebetween, and
   the second cathode and the supporting substrate are spaced apart from each other with the second anode therebetween.

6. The display device as claimed in claim 3, wherein:
   when an input signal is applied to the TFT, an amount of current flowing through the first output electrode equals the amount of current flowing through the second output electrode.

7. The display device as claimed in claim 1, further comprising:
   a barrier layer between the supporting substrate and the active layer;
   a gate insulating film between the active layer and the control electrode and insulating the active layer from the control electrode; and
   an interlayer insulating film between the control electrode and the first OLED, wherein:
   the first output electrode is in contact with a first surface of a source area of the active layer via a first through hole, which penetrates the interlayer insulating film and the gate insulating film, and
   the second output electrode is in contact with a second surface of the source area of the active layer via a second through hole, which penetrates the supporting substrate and the barrier layer.

8. The display device as claimed in claim 7, wherein the second through hole has a circular shape in a plan view and is tapered from the second surface to the first surface of the supporting substrate.

9. The display device as claimed in claim 7, wherein the first output electrodes and the second output electrodes partially overlap with each other.

10. The display device as claimed in claim 7, further comprising:
- a first planarization layer between the interlayer insulating film and the first OLED;
- a first encapsulation area on the first OLED and encapsulating the first OLED;
- a second planarization layer between the supporting substrate and the second OLED; and
- a second encapsulation area on the second OLED and encapsulating the second OLED.

11. The display device as claimed in claim 7, further comprising:
- a thickness control layer directly on the second surface of the supporting substrate, wherein the second through hole penetrates the thickness control layer.

12. The display device as claimed in claim 1, wherein:
- the display device is a double-sided display device having first display areas and second display areas,
- the first display area is on the first surface of the supporting substrate and includes a first pixel to emit light of first color and a second pixel to emit light of a second color different from the first color,
- the second display area is on the second surface of the supporting substrate and includes a third pixel to emit light of the first color and a fourth pixel to emit light of the second color,
- the first OLED defines the first pixel of the first display area, and
- the second OLED defines the third pixel of the second display area.

13. The display device as claimed in claim 12, further comprising:
- a third OLED on the first surface of the supporting substrate and defining the second pixel of the first display area, wherein the second OLEDs and the third OLEDs partially overlap with each other.

14. The display device as claimed in claim 12, further comprising:
- a third OLED on the first surface of the supporting substrate and defining the second pixel of the first display area;
- a first color conversion pattern on the first OLED; and
- a second color conversion pattern on the third OLED, wherein the first OLEDs and the third OLEDs emit light of a same color.

15. A display device, comprising:
- a TFT to control an amount of current flowing through a channel area of
- an active layer;
- a first OLED electrically connected to a first output terminal of the TFT; and a second OLED electrically connected to a second output terminal of the TFT, wherein the first and second output terminals are vertically positioned on opposite sides of the TFT, wherein the first OLEDs and the second OLEDs are to emit light in different directions.

* * * * *